United States Patent [19]

Velie

[11] Patent Number: 5,679,155
[45] Date of Patent: *Oct. 21, 1997

[54] METHOD AND APPARATUS FOR SOLDERING CIRCUIT BOARDS

[75] Inventor: Larry N. Velie, El Toro, Calif.

[73] Assignee: Velie Circuits, Inc., Costa Mesa, Calif.

[*] Notice: The term of this patent shall not extend beyond the expiration date of Pat. No. 5,480,483.

[21] Appl. No.: 436,333

[22] PCT Filed: Sep. 20, 1993

[86] PCT No.: PCT/US93/08950

§ 371 Date: May 18, 1995

§ 102(e) Date: May 18, 1995

[87] PCT Pub. No.: WO95/08403

PCT Pub. Date: Mar. 30, 1995

Related U.S. Application Data

[60] Continuation-in-part of Ser. No. 98,847, Jul. 29, 1993, Pat. No. 5,480,483, which is a division of Ser. No. 851,912, Mar. 16, 1992, Pat. No. 5,246,731.

[51] Int. Cl.[6] .............................. H05K 3/34; B05C 5/04
[52] U.S. Cl. .............................. 118/101; 118/106; 118/301; 118/316
[58] Field of Search .............................. 228/36; 427/96, 427/97; 118/45, 50, 68, 69, 71, 101, 100, 106, 301, 315, 316

[56] References Cited

U.S. PATENT DOCUMENTS

| | | | |
|---|---|---|---|
| 4,127,692 | 11/1978 | Boynton | 427/96 |
| 4,493,857 | 1/1985 | Knigge | 427/96 |
| 4,720,324 | 1/1988 | Hayward | 156/645 |
| 4,903,631 | 2/1990 | Morris | 118/63 |
| 5,480,483 | 1/1996 | Velie | 118/101 |

FOREIGN PATENT DOCUMENTS 3810653  5/1988  Germany.

*Primary Examiner*—Donald E. Czaja
*Assistant Examiner*—Calvin Padgett
*Attorney, Agent, or Firm*—Harold L. Jackson

[57] ABSTRACT

A method and apparatus for depositing solder on the terminal pads (10) of printed circuit boards (12) in which a solder resist layer (16) or layers (16, 17) having a thickness corresponding to the desired solder height border the pads. Molten solder from a reservoir (58) is directed by nozzles (72) against the sides of the board (12) to fill the cavities extending above the terminal pads while the board (12) is moving via a conveyor mechanism relative to the reservoir (58). The cavities when filled with molten solder are covered by a suitable element such as a flexible belt (52) or roller. The molten solder within the covered cavities is then cooled below its solidification point and the covering element removed. If desired, part or all of the solder resist layer (16) or layers (16, 17) may then be stripped from the board (12) to leave solder pads extending above the surface of the board (12).

20 Claims, 6 Drawing Sheets

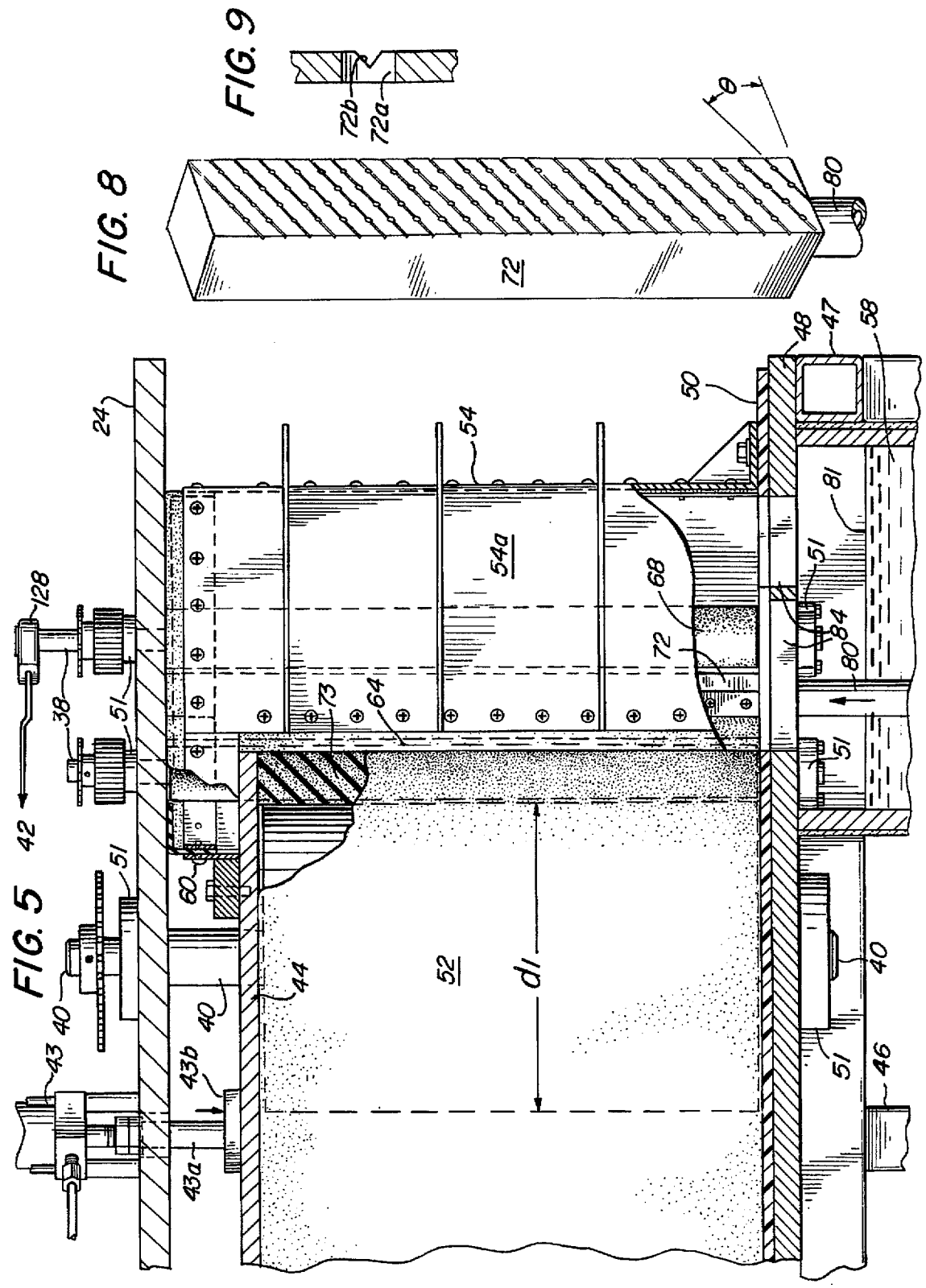

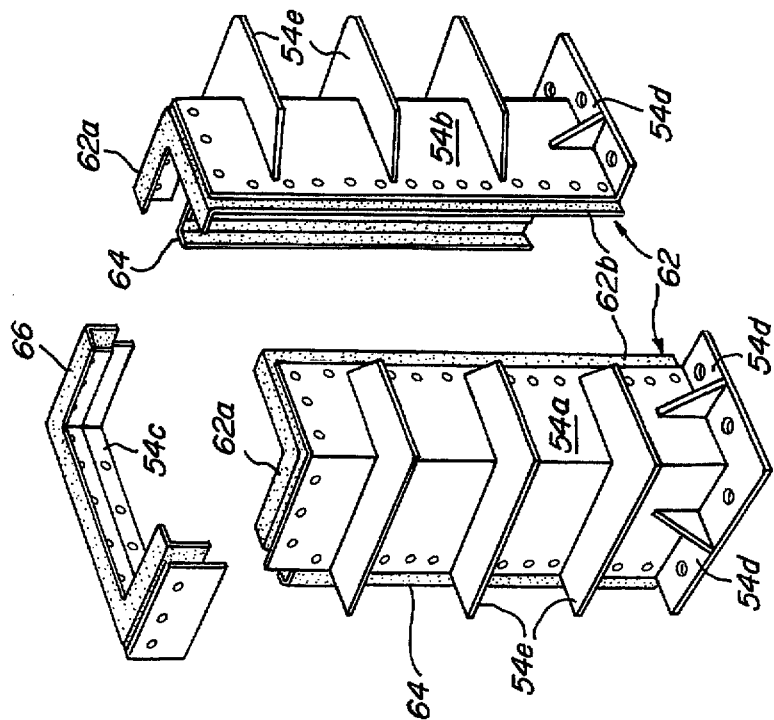
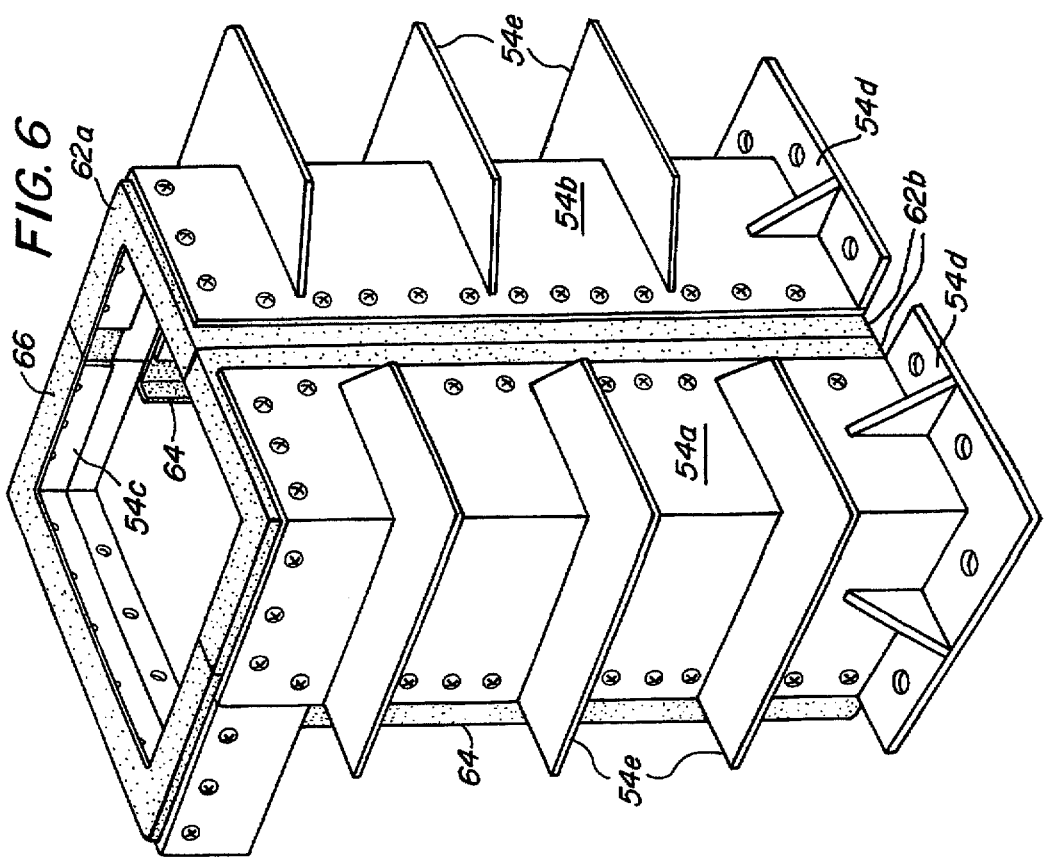

METHOD AND APPARATUS FOR SOLDERING CIRCUIT BOARDS

This application is a National Stage Application under 35 U.S.C. 371 of Internal Application PCT/US93/08950, having an international filing date of Sep. 20, 1993 which is continuation-in-part of U.S. application Ser. No. 08/098,847, filed Jul. 29, 1993, now U.S. Pat. No. 5,480,483, which is a divisional of U.S. application Ser. No. 07/851,912, filed Mar. 16, 1992, now U.S. Pat. No. 5,246,731.

TECHNICAL FIELD

The present invention relates to printed circuit boards and more particularly to a method and apparatus for applying solder to the contact points or terminal pads on a circuit board which are to be electrically and mechanically connected to circuit component.

BACKGROUND ART

The electronics industry has become increasingly dependent on printed circuits for the interconnection of electronic components. Initially the electronic components were secured to the boards via leads which extended through holes in the boards. Today many components such as integrated circuits ("ICs") are mounted directly to the surface of the boards, i.e. by soldering the leads directly to terminal pads on the boards.

Technological improvements in integrated circuits have resulted in increased terminal lead densities with the attendant requirement of increased terminal pad densities on the printed circuit boards. The distance between the leads (i.e. pitch) of integrated circuits of the order of 0.008 inches (i.e. 8 mils) are not uncommon. Such a density requires that the spacing between the edges of the circuit board terminal pads be of the order of 4 to 5 mils.

To accommodate surface mounted components, such as ICs, on circuit boards, it is necessary to accurately apply solderable material such as a tin/lead alloy ("solder") or a solder containing paste to the circuit board terminal pads prior to the mounting operation. Once the solder or solder paste has been applied to the terminal pads, the surface mounted components can then be secured on the board by a suitable adhesive or the paste itself with the leads in contact with the terminal pads. The assembly is then heated by means of an oven, heat lamp etc. to a temperature sufficient to melt the solder to form an electrical and mechanical bond between the terminal pads and the component leads.

One method commonly used to apply solder to the terminal pads of printed circuit boards is called dip soldering. In accordance with this method, the circuit board is dipped into a bath of molten solder and removed so that the metalized areas of the board (e.g. terminal pads) receive a layer of solder. However, due to the solder's surface tension, the resulting layer is generally dome shaped, as is illustrated in FIG. 1 of the drawings. Streams of hot air may be used to remove some of the excess solder. However, the depth of the solder on the terminal pads will vary. When surface mounted components, such as IC's with high density lead terminals, are mounted on the board and the solder heated, some of the lead terminals may not be wetted by the molten solder because of the uneven height of the solder on the pads. While the open circuits resulting from the insufficient depth of solder may be correctable, the time and cost of finding and remedying the open circuits is significant.

Another method commonly used to apply solder to terminal pads involves the use of a solder paste which is deposited on the terminal pads by silk screening or mask printing techniques. The surface mounted components are then placed on the board so that their lead terminals are embedded in the paste on the terminal pads. The components are held in place by the surface tension of the paste. The assembly is then heated to melt the solder and evaporate the volatile components and solvents of the paste. The paste, however, is expensive and difficult to apply. In addition, the paste may not accurately follow the contours of the pads resulting in an unacceptable finished product.

More recently two additional methods of applying solder to the terminals pads of printed circuit boards have been disclosed in the prior art, German Patent No. DE 3,810,653 which issued to Dieter & Gretta Friedreich on May 18, 1988, teaches a method for depositing solder on the terminal pads on one side of a circuit board in which a sacrificial solder resist mask is used to border the terminal pads and define the height of the solder. In accordance with the Friedreich patent, the board with the sacrificial mask in place is dipped into a bath of molten solder and a flat covering device, such as a plate, is then clamped against the board to hold the solder in place and within the cavities on the board formed by the boarding mask and the terminal pads. The board and covering device are lifted as a unit from the solder bath and as soon as the solder solidifies, the covering device is removed. The sacrificial mask is then stripped from the board leaving a layer of solder on each of the terminal pads. While this method may deposit a uniform layer of solder on the pads it is limited to relatively small circuit boards and not amenable to mass production.

U.S. Pat. No. 4,720,324, which issued to John S. Hayward on Jan. 19, 1988, discloses a method in which a layer of a tin/lead alloy is electroplated onto the terminal pad areas and subsequently heated and amalgamated into solder in the presence of flux to wet the leads of the surface mounted components. The '324 process requires several complex electroplating, stripping and etching steps which would add considerably to the cost of the resulting assembly.

There is a need for a simple and reliable method and apparatus for applying a uniform layer of solder to the conductive terminal pads of printed circuit boards which is amenable to mass production techniques.

SUMMARY OF THE INVENTION

A printed circuit board having terminal pads on at least one side thereof is provided with one or more solder resist layers covering the side except for the terminal pads. The solder resist layer or layers have a thickness corresponding to the desired height of the solder to be applied and form cavities above the terminal pads. A reservoir of molten solder is provided and a stream of molten solder from the reservoir is directed against the side or sides of the board containing the terminal pads commencing at the front edge and ending at the rear edge while the board is positioned in a vertical plane and moving along a horizontal axis past the reservoir. The cavities, when filled with molten solder, are immediately covered by a covering element to confine the solder against the terminal pads and within the cavities. The molten solder within the covered cavities is then cooled below its solidification point and the covering element is removed.

Preferably at least one pair of rollers are used to hold the board in a vertical plane and move the board along a horizontal axis past the solder applicator to the covering element. The solder applicator, in the form of a pump and one or more nozzles, direct solders from the reservoir against the side(s) of the board along a first vertically oriented zone commencing at the front and ending at the rear of the board. Preferably an inert gas such as nitrogen is maintained within the chamber which surrounds the first or solder application zone to inhibit oxidation of the molten solder. The cavities may be covered by means such as a belt or roller which is compressed against the side or sides of the board along a second vertically oriented zone located adjacent the first zone. Preferably a pool of molten solder extends along the sides or sides of the board up to the point where the board enters the covering belt or roller. The solder within the covered cavities may be cooled, for example, by maintaining the surface temperature of the roller or belt below the solidification temperature of the solder. As the board emerges from the covering belt or roller, the solidified solder extends from the terminal pads to an upper surface which is substantially flat and coplanar with the top surface of the solder resist layer or layers.

Where a sacrificial solder resist layer has been used, it may be removed (and normally is) to leave the circuit board with exposed solder pads suitable for electrically and mechanically bonding the leads of surface mount components such as ICs to the board.

The features of the present invention can best be understood by reference to the following description taken in conjunction with the accompanying drawings wherein like numerals designate like components.

BRIEF DESCRIPTION OF THE DRAWINGS

FIG. 5 is an enlarged side elevational view of the front portion of the apparatus of FIG. 3, without the for the solder station rollers drive motor, partially in cross section and partially broken away;

FIG. 6 is a perspective view of the housing for enclosing the solder application station for inhibiting the egress of inert gas therefrom;

FIG. 7 is an exploded view of the housing of FIG. 6;

FIG. 8 is a perspective view of one of the solder application nozzles;

FIG. 9 is an enlarged cross-sectional view of one of the holes and intersecting grooves in the solder application nozzle of FIG. 8;

DESCRIPTION OF THE PREFERRED EMBODIMENT

Figure 1:
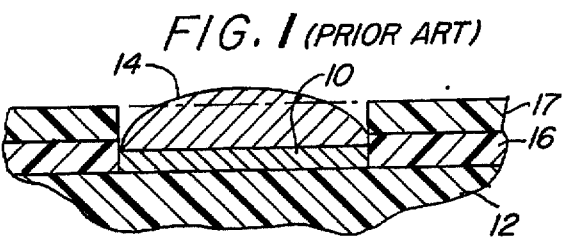
FIG. 1 is a cross-sectional view of a portion of a printed circuit board showing a terminal pad with solder deposited thereon in accordance with the prior art dip soldering process.

Referring now to the drawings and particularly to FIG. 1, a terminal (or surface mount) pad 10 on a section of a printed circuit board 12 is illustrated with solder 14 deposited thereon in accordance with the prior art dip soldering process. A conventional permanent solder resist layer 16, for protecting the traces, overlays the surface of the board except for the metalized areas such as the terminal pads which are to receive the solder. A temporary solder resist layer 17 overlaps the permanent layer 16. As discussed previously the solder 14, due to surface tension, assumes a dome shape. The height of the dome will vary among terminals having different as well as the same dimensions. Where a hot air leveling step is used to level the solder, an irregular surface generally results.

Figure 2:
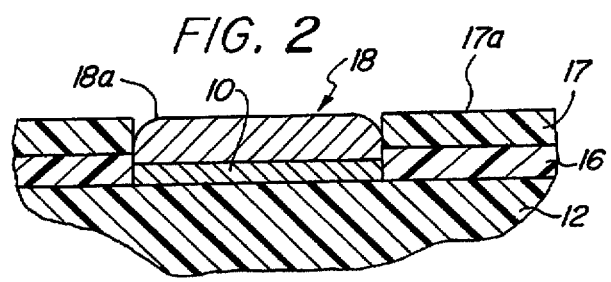
FIG. 2 is a cross-sectional view of a portion of a printed circuit board showing a terminal pad with solder deposited thereon in accordance with the method and apparatus of the present invention.

FIG. 2 illustrates a pad of solder 18 on terminal pad 10 which has been processed in accordance with my invention. The solder pad 18 has a flat upper surface 18a which is coplanar with the exposed surface 17a of solder resist layer 17 which extends over the permanent or primary solder resist layer mask 16. The combined thickness of the solder resist layers 16 and 17 determines the height of the solder pads 18.

To apply solder to the terminal pads of a circuit board in accordance with my invention, it is first necessary to apply one or more solder resist layers, such as 16 and 17, to the side or sides of the circuit board which contains the terminal pads. The solder resist layer(s) cover the side or sides of the circuit board except for the areas of the terminal pads (or contact points) to receive the solder. The solder resist layer(s) border the terminal pads and define cavities extending above the pads. The thickness of the layer(s) determines the height of the resulting solder as discussed. Typically the primary or permanent solder resist layer 16 has a thickness of the order of 0.001 to 0.003 inches. A temporary or sacrificial solder resist layer or mask 17 should be used to provide the proper solder height and mask the areas of the board which are not to receive solder. For example, a photosensitive solder resist sacrificial mask having thicknesses of the order of 0.002 to 0.005 inches may be placed over the entire surface of the side or sides of the board containing the terminal pads. The background areas may be exposed to light in a conventional manner. After exposure the circuit board may be placed in a bath that washes away the unexposed areas. A suitable sacrificial mask is distributed by DuPont Corporation under the Trademark designation OPTIMASK. After the solder deposition process has been completed, as will be described hereinafter, the sacrificial mask should be removed by conventional techniques.

Figure 3:
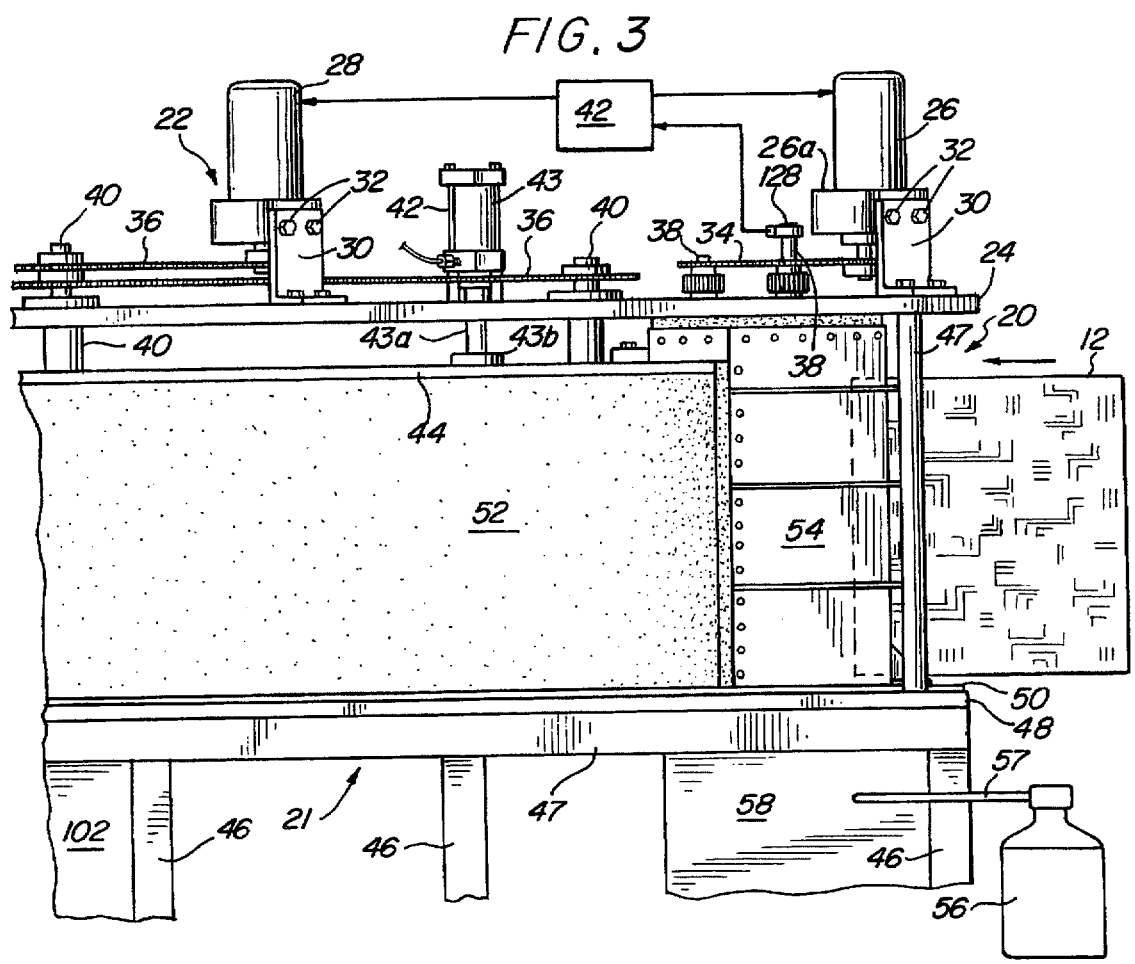
FIG. 3 is a side elevational view of the front section of an apparatus in accordance with the present invention illustrating a printed circuit board entering the solder application zone.
Figure 4:
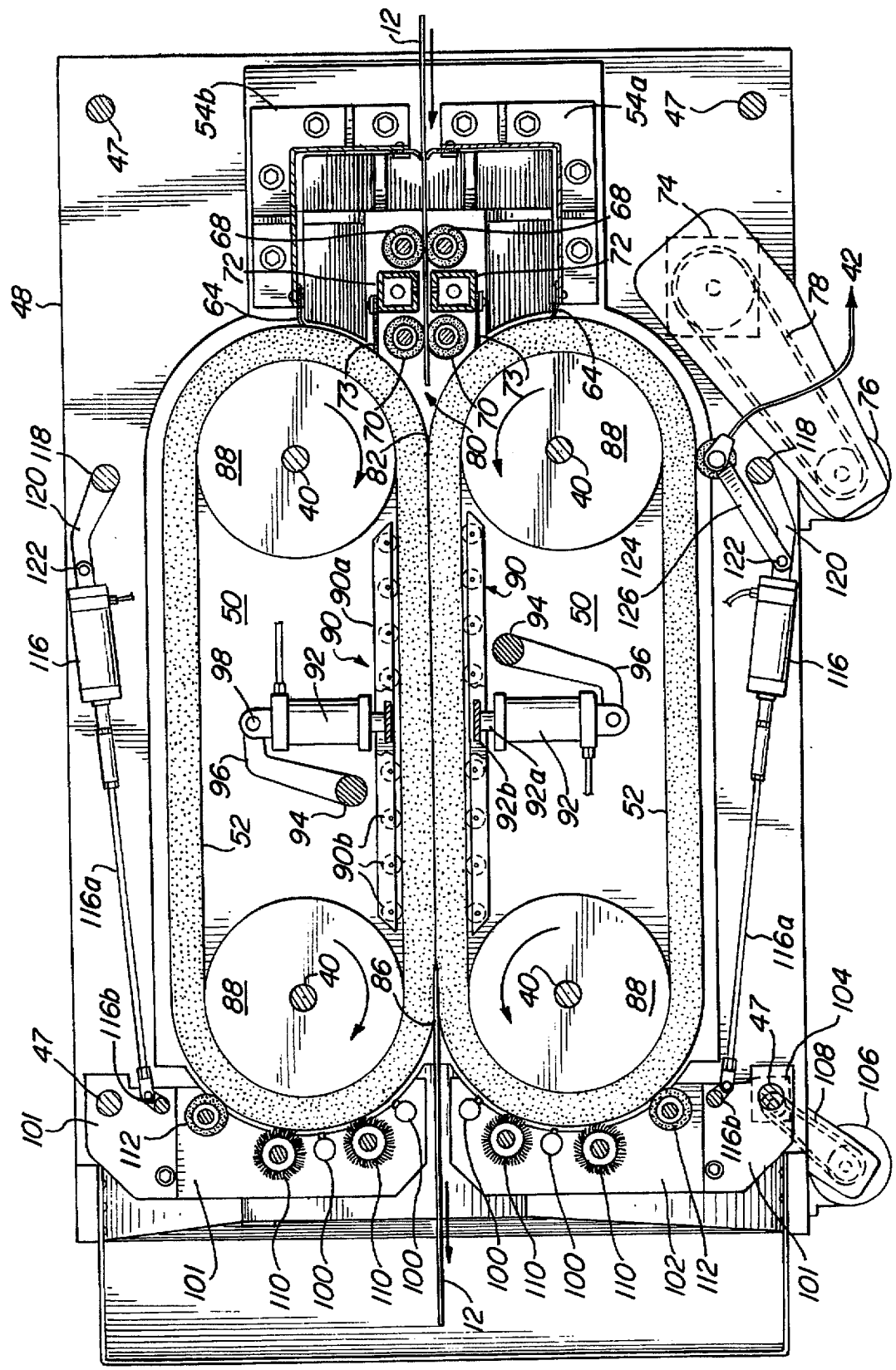
FIG. 4 is a schematic top plan view showing a pair of molten solder application nozzles, rollers for feeding the circuit board past the solder nozzles and into a pair of covering belts, oil nozzles and brushes for applying and removing lubricating oil from the belts.

Referring now to FIGS. 3–9 and particularly to FIGS. 3 and 4 there is illustrated an apparatus for applying solder to the conductive terminal pads of the circuit board 12 of FIG. 2. The circuit board 12 may be formed of a suitable multiple layer insulation material with internal conductors and component surface mounts or terminal pads 10 on one or both sides of the board. Typically the board may have four or more layers with a resulting thickness of about 0.062 inches and terminal pads on each surface.

The circuit board 12 is positioned in a vertical plane and inserted into the front end 20 of a solder application apparatus indicated generally at 22 and having a frame 21 for supporting the various components as will be described. As the board 12 moves along the vertical plane through the apparatus a uniform layer of solder is deposited on the terminal pads as will be described in more detail.

The solder apparatus 22 includes a top plate 24 on which solder station and covering belt roller drive motors 26 and 28, respectively, are secured by brackets 30 and bolts 32 as illustrated. Chains 34 and 36 connect the motors 26 and 28 with conventional sprockets affixed to solder station roller shafts 38 and covering belt roller shafts 40, respectively. A controller 42 which may be a mini computer, controls the speed of the motors 26 and 28 to propel (or convey) the board 12 through the solder application apparatus at the appropriate speed. A plurality of pneumatic rams 43 (only one of which is shown) are mounted on the top plate 34 and apply a downward pressure to a vertically moveable sealing plate 44 via shaft 43a and foot 43b. The rams force the plate 44 against the top of a pair of covering belts as will be explained in more detail.

The frame 21 includes legs 46 secured to peripheral tubular members 47 which support a bottom plate 48 above the floor. Vertical spacer posts 47 support the top plate thereon as illustrated. A teflon sheet (or plate) 50 overlays the bottom plate 48 and engages the bottom surfaces of a pair covering belts 52, only one of which is shown in FIG. 3. The roller shafts 38 and 40 are journaled in suitable bearings 51 secured to the top and bottom plates. (See FIG. 5).

The covering belts 52 extend between the plates 44 and 46 and are driven by rollers to be described in conjunction with FIG. 4. A solder station housing, indicated generally at 54, extends between plates 24 and 48 at the front of the apparatus and engages the outer surfaces of the belts 52. The housing 54 encloses the solder application station (or solder station) section of the apparatus and allows an inert gas such as nitrogen to surround the portion of the printed circuit board 12 to which the molten solder is being applied. Such an inert gas inhibits the oxidation of the solder. A cylinder 56, of nitrogen (or other inert gas), is connected via a conduit 57 to the upper end of a solder reservoir 58 (to be described) to provide a nitrogen atmosphere within the solder station and above the surface of the molten solder as will be described in more detail in conjunction with FIG. 4

Referring now to FIGS. 4–7 and particularly FIGS. 6 and 7, the inert gas containment housing 54 which surrounds the solder station on three sides, includes left and right hand sections 54a and 54b, respectively, and an upper rear section 54c. The rear section 54c is bolted to an L-shaped bracket 60 which in turn is bolted to the moveable plate 44. See FIG. 5. The left and right hand sections include horizontally extending base flanges 54d which are bolted to the bottom or base plate 48. The sections 54a and b may also include stiffening flanges 54e. Semi-resilient sealing strips 62, 64 and 66 (made of teflon, for example) are secured to the sections 54a, 54b and 54c (by suitable bolts, for example) as illustrated in FIGS. 6 and 7. The strips 64 and the top portions 62a of strips 62 engage the stationary top plate 24 to provide the top seal for the housing 54.

The vertical sections 62b of the strips 62 engage the sides of a circuit board (or each other in the absence of a board) to inhibit the escape of gas (and molten solder) from the front 20 of the apparatus. The sealing strips 64 engage the sides of the covering belts 52 as is best illustrated in FIG. 4 to inhibit the egress of the inert gas along the sides of the covering belts approaching the solder station.

Referring now to FIG. 4, a pair of solder nozzle entry rollers 68 and a pair of solder nozzle exit rollers 70 (preferably made of steel) are carried by shafts 38. The rollers of each pair (i.e., entry and exit) are positioned on opposite sides of the vertical plane along which the circuit board travels through the apparatus as illustrated. A pair of tubular solder nozzles 72 (closed at the top end) are positioned between the rollers 68 and 70 at opposite sides of a vertical plane through which the circuit board moves through the apparatus, as is shown in FIG. 4. The sides of the solder nozzles facing the plane of travel of the circuit board are preferably spaced 0.125 inches apart and equidistant from such plane. Resilient sealing strips 73 (also preferably made of teflon are secured to the sides of the nozzles 72 (by screws, for example) and engage the outer surfaces of the belts 52 to inhibit the flow of molten solder along the sides of the covering belts.

The reservoir 58 of molten solder extends below the solder nozzles (and below the bottom plate 44). A liquid solder pump 74 is positioned with the solder reservoir and driven by an electric motor 76 (mounted on the frame) via a chain drive mechanism 78. Molten solder is pumped to the interior of the tubular solder nozzles from the pump 74 via conduit 80. The inert gas conduit 57 terminates inside of the solder reservoir above the level 81 of the molten solder.

Referring now to FIGS. 8 and 9 each solder nozzle 72 has a plurality of holes 72a therein (preferably about 0.050 to 0.070 inches in diameter) through which molten solder is directed against the sides of the circuit board. The holes are spaced on about 0.60 to 0.80 and preferably on about 0.70 inch centers and are arranged in groups aligned along an angle $\Theta$ to the horizontal. The angle $\Theta$ is preferably within the range of about 30° to 60° and most preferably about 45°. V-shaped grooves 72b, approximately 0.06 inches wide and 0.030 inches deep, intersect the holes along the diagonal or angle $\Theta$ as shown. The holes and grooves serve to provide a turbulent flow of molten against the sides of the board to insure that the cavities formed by the terminal pads and the boarding layers are completely filled with solder.

A pool of molten solder exists on both sides of the board 12 from the areas adjacent nozzles 72 and extends into the area 80 between the nozzle inlet rollers 70 and the circuit board entry point 82 into the covering belts 52. The bottom plate 48 has solder return openings 84 therein for returning excess molten solder (via gravity) to the reservoir.

After exiting the solder application station the board enters the covering belts 52 which are preferably made of high temperature silicon rubber and preferably have a thickness within the range of 1 to 3 inches and most preferably about 1¾ inches. The covering belts 52 converge and are in intimate contact for a predetermined distance $d_2$ (i.e., from the board entry point 82 to the exit point 86). The distance $d_2$ or convergence span of the belts is within the range of about 3 to 30 inches, preferably within the range of 12 to 30 inches and most preferably about 24 inches. The resilient and compressible silicon rubber belts 52 are not wetted by the solder and are forced against the sides of the board to hold the molten solder in place until the solder solidification or eutectic point is reached.

Each of the covering belts 52 is driven by a pair of rollers 86 mounted on shafts 40. The rollers 86 are preferably about 9 inches in diameter ($d_1$, FIG. 5) and made of steel.

A pair of roller plates 90, comprising brackets 90a with vertically aligned rollers 90b secured therein, are positioned adjacent the inner surfaces of the belts 52. A pair of pneumatic rams 92 are secured to the frame 21 by posts 94, arms 96 and pins 98. The rams apply pressure to the roller plates 90 via shafts 92a and feet 92b to force the covering belts against the sides of the circuit board with an appropriate pressure to prevent molten solder from migrating out of the cavities above the terminal pads. Such pressure is preferably above 2 psi and most preferably within the range of about 3 to 5 psi.

The pneumatic rams 43 apply sufficient pressure to the floating plate 44 (which may be provided with a teflon sheet on its lower surface) to cause the upper and lower edges of the covering belts 52 bear against the plates 44 and 50.

An oil application station is positioned at the rear or exit end of the apparatus for applying lubricating oil to the outer surfaces of the covering belts 52. This oil aids in releasing the solder within the cavities from the belts during the solidification process. The oil application station comprises a pair of tubular oil nozzles 100 (with spaced constricted openings 100a) mounted on separate sub-frames 101. Each sub-frame includes a top plate (101a) positioned just below the top plate 24 and a corresponding bottom plate (101b) positioned just above the bottom plate 48. See FIG. 11. The two plates of each sub-frame are secured together by suitable posts 101c and the tubular oil nozzles. Each sub-frame 101 is pivotally mounted on a respective post 47 so that the sub-frames can be pivoted into an operating position as shown in FIG. 4 or pivoted away from the belts 52 for inspection and maintenance purposes. The oil nozzles extend the height of the belts 52 and are positioned adjacent each belt at the exit end when the sub-frames are pivoted into the operating mode. The oil nozzles spray oil against the outer surfaces of the belts from an oil reservoir 102 positioned under the bottom plate 48. Oil from the reservoir is delivered to the oil nozzles via an oil pump 104 and suitable oil supply conduits (not shown). An electric motor 106, mounted on the frame, drives the oil pump through a chain drive 108.

Figure 11:
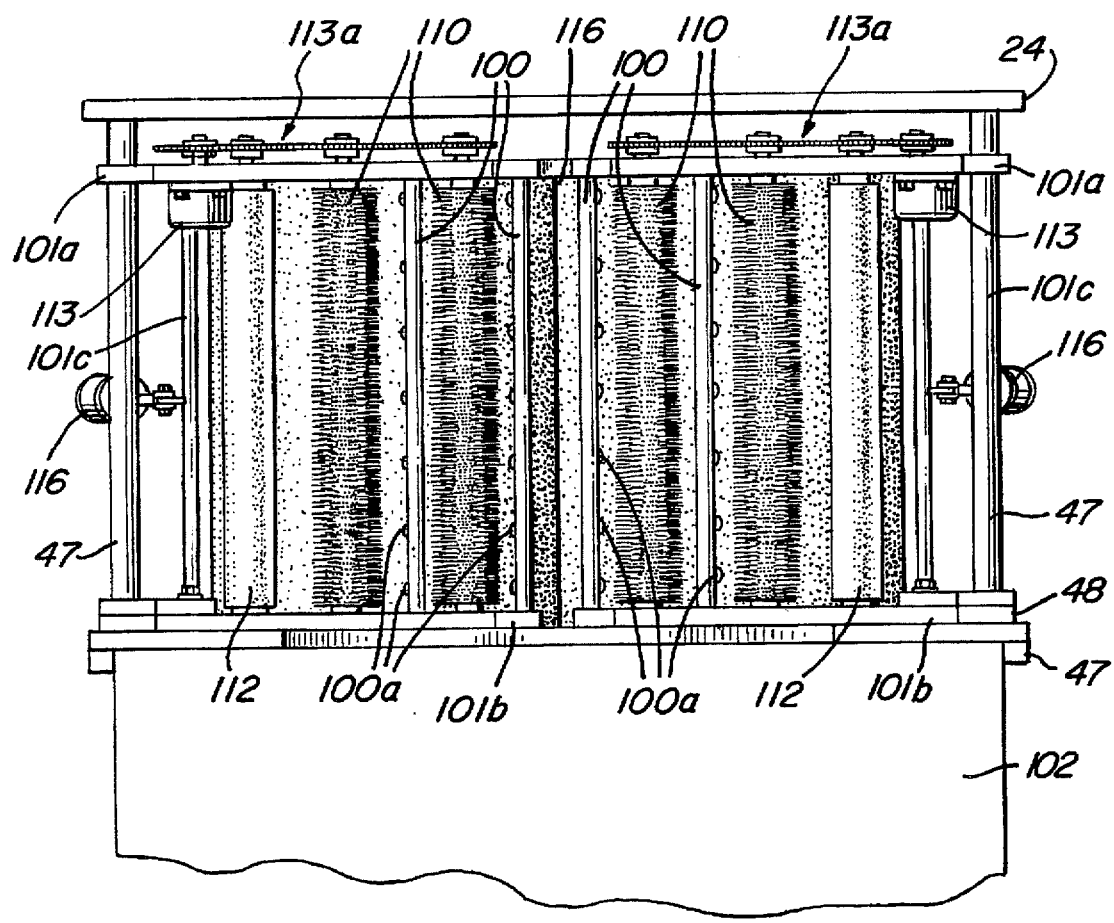
FIG. 11 is a rear elevational view of the apparatus, absent the components mounted on the top plate, showing the oil application station components.

A pair of roller brushes 110, extending the height of the belts, are also rotatably mounted on each sub-frame 101 adjacent the oil nozzles, as shown, for removing the cooling oil from the belts. A pinch roller 112 (made of steel, for example, and also extending the height of the belts) is also rotatably mounted on each sub-frame, downstream from the roller brushes, for removing additional oil from the belts as is illustrated in FIG. 4. The roller brushes and pinch rollers are driven by a suitable electric motor 113 carried by the upper plate 101a of the sub-frame through a conventional chain/sprocket drive indicated generally at 113a as shown in FIG. 11. The oil reservoir extends under the oil nozzles, roller brushes and pinch rollers (and bottom plate 48). Openings (not shown) in the bottom plate 48 return oil draining from the belts 52 back to the oil reservoir.

A pair of pneumatic rams 116 are mounted on the frame 21 via posts 118, arms 120 and pins 122. The rams are connected to the sub-frames 101 via shaft extensions 116a and offset pin members 116b. The rams, in the extended position, swing the sub-frames 101 away from the exit end of the belts for inspection and maintenance purposes and in the retracted position move the sub-frames 101 into their operating position as shown in FIG. 4.

A tachometer 124 is mounted on pin 122 via an arm 126 for providing a signal to the controller 42 which is representative of the linear velocity of the covering belts 52. Another tachometer 128 is coupled to the shaft 38 of one of the solder station rollers to provide a signal to the controller 42 which is representative of the speed of the rollers 68. The drive train between the solder station roller drive motor 26 and the rollers 38 includes a one-way slip clutch (included within the motor support housing 26a, FIG. 3) which permits the solder station rollers to rotate faster than the drive motor. This feature enables the lineal speed of the covering belts to be set at a value slightly greater than the speed at which the solder station rollers propel or convey the circuit board through the solder station. Such a speed setting allows the covering rollers to pull the circuit board through the solder station rollers while eliminating any sliding action between the board and the solder station rollers which would tend to dislodge the solder from the terminal pad cavities.

Figure 10:
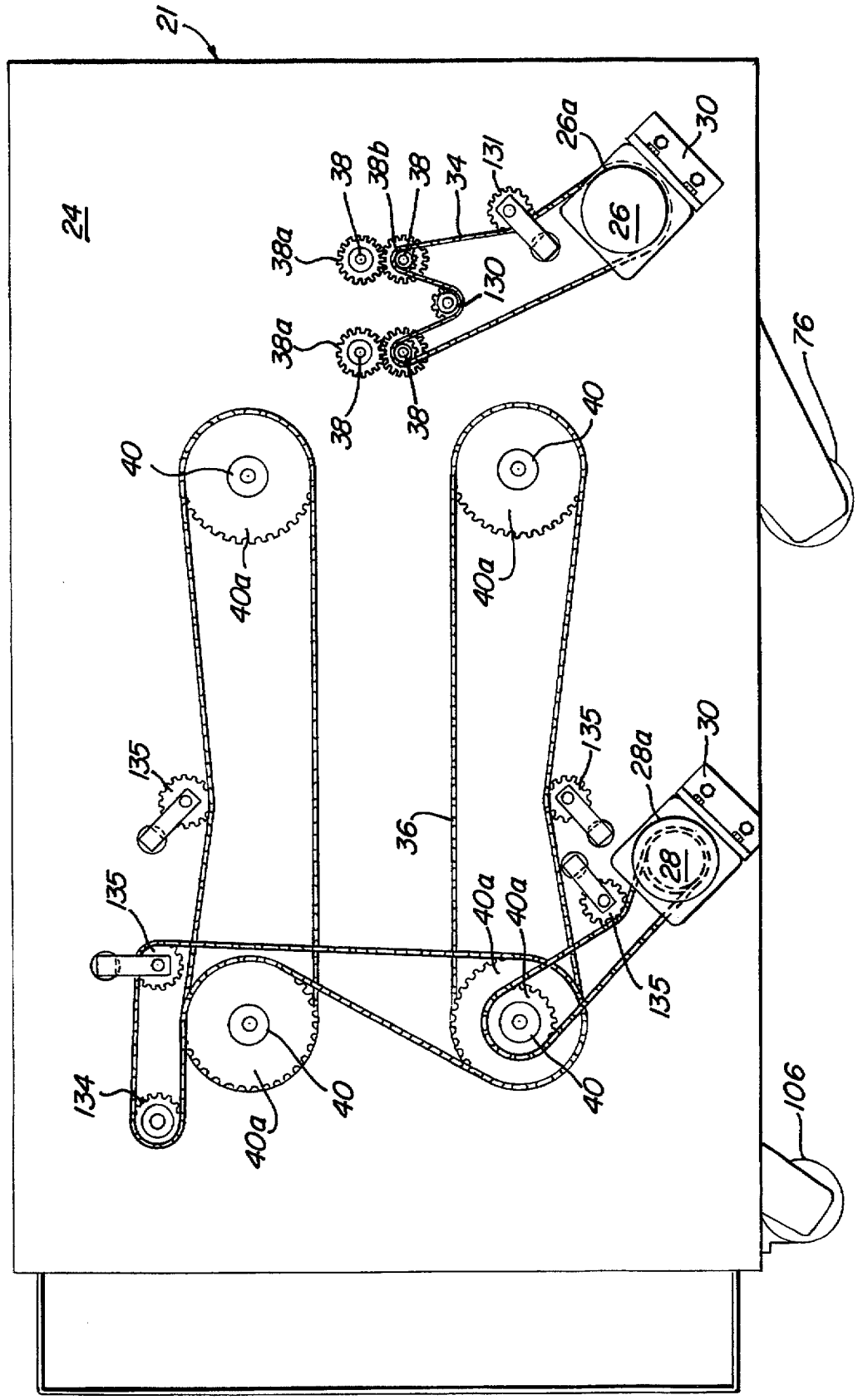
FIG. 10 is a top plan schematic view of the apparatus of FIG. 3 showing the drive mechanism for the rollers and belts.

The drive train for the solder station roller shafts 38 and the covering belt roller shafts 40 is illustrated in FIG. 10. The shafts of each opposing pair of solder station rollers (i.e., entrance and exit) are geared together via gears 38a and one shaft of each pair carries a sprocket 38b. A chain extends around the sprockets 38b, idler sprockets 130, a tension sprocket 131, and a sprocket 26a carried on the shaft of the drive motor 26.

The drive train from the covering belt rollers 88 includes sprockets 40a (mounted on shafts 40), idler sprocket 134 and tension sprockets 135.

Prior to placing the apparatus in operation, the solder within the reservoir 58 is heated by an appropriate heater (not shown) until the solder is in a molten state. I have found that it is desirable to heat the solder to a temperature of about 430° to 440° F., although a lower or higher temperature may be desirable depending upon the dimensions of the apparatus and other parameters. Solder, a tin/lead alloy, is typically in a solid state at about 361° F. A 60% tin/40% lead alloy is in its molten state above about 371° F. and in its completely solid state below about 361° F. A higher tin content changes the melting temperature somewhat and the temperature range where the alloy is partly solidified and partly liquid as is well known in the art.

The oil in the reservoir may also be cooled (or heated), if desired, to an appropriate temperature for contact with the belts. I have found that room temperature provides satisfactory results. The belts are preferably preheated (for example, by infrared heaters) to an appropriate temperature for contact with an initial circuit board.

After the solder and belts are at the appropriate temperatures and the solder station is flooded with nitrogen (or an other inert gas), the motors 26 and 28 and pumps 74 and 104 may be turned on via the controller 42. A circuit board 12, on which one or more layers of a solder resist layer have been applied to form a border for the terminal pads (which are to receive solder), is then inserted (manually or by a separate conveyor) through the entrance sealing strips 62b and into the entrance rollers 68 and the solder station. The sealing strips 62b, which slide along the surface of the board and the sealing strips 64 and 73 which engage the outer surfaces of the belts 54, substantially prevent nitrogen and liquid solder from migrating outside of the solder station.

The solder nozzles 72 direct streams of turbulent molten solder against both sides of the board 12 along a vertically oriented zone as illustrated and provide a pool of molten solder extending to the covering belt entrance point 82. This action fills the cavities extending above the terminal pads.

The terminal pad cavities, which have been filled with solder at the solder application station, are immediately covered by the compressible rubber belts 52. During the travel between the belts (e.g. 24 inches in length) the solder within the cavities is cooled to a temperature at or below its solidification point e.g. about 361° F.

The compression of the rubber belts 52 against the sides of the circuit board firmly holds the molten solder within the terminal pad cavities and prevents the solder form migrating out of the cavities by the force of gravity. Preferably the belts 52 are forced against the sides of the circuit board with a pressure within the range of 3 to 5 psi.

The board then exits the covering belts 52 and may be manually or automatically removed from the rear of the apparatus. While only two circuit boards 12 are shown in FIG. 4, it is to be understood that the apparatus will accommodate a series of boards on a production line basis.

There has thus been described a method and apparatus for depositing a uniform layer of solder on the terminal pads of printed circuit boards on an assembly line basis. Various modifications will be apparent to those skilled in the art without involving a departure from the spirit and scope of my invention as defined in the appended claims.

I claim:

1. In an apparatus for applying solder to the conductive terminal pads on at least one side of a printed circuit board while the board is positioned substantially vertically and moving along a horizontal axis, the board containing a solder resist layer covering said at least one side except for the areas of the terminal pads, the solder resist layer having a thickness corresponding to the desired height of the solder to be applied and forming cavities extending upwardly from the terminal pads to the outer surface of the resist layer, the combination comprising:
   a) a frame having a front end through which the board enters and a rear end through which the board exits the apparatus;
   b) at least one pair of vertically oriented solder station rollers positioned on opposite sides of a vertical plane adjacent the front end of the frame and rotatably mounted thereon;
   c) a solder application station mounted on the frame adjacent the solder station rollers, the solder station including at least one solder nozzle positioned along a substantially vertical line adjacent the path of movement of the board, a reservoir of molten solder and a pump for conducting molten solder from the reservoir to the nozzle, the nozzle being arranged to direct molten solder against the side of the board containing the terminal pads; and
   d) at least one covering belt having a vertically oriented outer surface located downstream from the solder application station for engaging the side of the board containing the terminal pads to confine the solder within the cavities until the solder is cooled below its melting point.

2. The apparatus of claim 1 wherein the reservoir is positioned below the circuit board when the board is moving along said horizontal axis.

3. The apparatus of claim 2 including means for funneling excess solder that does not fill the cavities back into the reservoir.

4. The apparatus of claim 3 wherein the covering belt includes a compressible material which is compressed against said at least said one side of the board over a width of at least 3 inches.

5. The apparatus of claim 4 wherein said at least one belt has a thickness within the range of 1 to 3 inches.

6. The apparatus of claim 5 wherein said at least one belt is made of silicon rubber.

7. The apparatus of claim 5 wherein the covering element is compressed against said at least one side of the board with a pressure within the range of about 1 to 3 psi.

8. The apparatus of claim 7 wherein the solder nozzle comprises at least one elongated tubular member having a plurality of holes therein and a plurality of grooves extending between holes to cause the molten solder to issue from each of the holes in a turbulent spray.

9. The apparatus of claim 1 wherein the board contains conductive terminal pads on each side of the board, the solder resist layer covering each side except for the terminal pad areas and wherein said at least one solder nozzle comprises nozzles being positioned on opposite sides of the vertical plane of travel along which the board travels.

10. The apparatus of claim 5 further including means for surrounding the molten solder with an inert gas to inhibit the oxidation thereof.

11. An apparatus for applying solder to the conductive terminal pads on two sides of a printed circuit board while the board is positioned in a vertical plane and traveling along a horizontal axis, the board containing a solder resist layer covering the sides thereof except for the terminal pads, the solder resist layer having a thickness corresponding to the desired height of the solder to be applied and forming cavities extending upwardly from the terminal pads to the outer surface of the resist layer, comprising:
   a) a frame having a front end through which the circuit board enters and a rear end through which the circuit board exits the apparatus;
   b) a pair of belt drive rollers rotatably mounted on the frame and on opposite sides of the vertical plane;
   c) a resilient covering belt extending around each pair of rollers, the covering belt drive rollers being positioned so that the outer surfaces of the belts are in intimate contact from a circuit board entry point to an exit point for applying a compressive force to the circuit board positioned between said entry and exit points;
   d) at least one pair of solder station rollers rotatably mounted on the frame between the covering belts and the front end of the apparatus, the nozzle station rollers being positioned on opposite sides of the vertical plane of travel of the circuit board and arranged to engage the sides of the circuit board for moving the board along the vertical plane to the entry point of the covering belts;
   e) a solder nozzle positioned on each side of the vertical plane along which the circuit board travels and between the solder station rollers and the covering belts entry point for directing streams of molten solder against the sides of the board to fill the terminal pads cavities; and
   f) motor means for rotating the covering belt rollers and the solder station rollers to propel the board past the solder nozzles and through the covering belts from the entry to the exit points thereof.

12. The apparatus of claim 11 further including a solder station housing extending around the solder station nozzles, the solder station rollers and engaging the covering belts adjacent the circuit board entry point to allow molten solder to form a pool surrounding the sides of the circuit board between the solder nozzles and the covering belts entry point.

13. The apparatus of claim 12 further including means for applying pressure to the inner surfaces of the covering belts between the board entry and exit points to force the belts against the sides of the circuit board with a pressure in excess of 2 psi.

14. The apparatus of claim 13 wherein the covering belt pressure application means is arranged to compress the belts against the sides of the circuit board with a pressure within the range of about 3 to 5 psi.

15. The apparatus of claim 13 wherein the solder station housing is arranged to inhibit the egress of gas from the area surrounding the molten solder and further including means for supplying an inert gas to the area surrounding the molten solder.

16. The apparatus of claim 15 wherein a distance between entry and exit points of the covering belts is within the range of 3 to 30 inches.

17. The apparatus of claim 16 wherein the covering belts have a thickness within the range of 1 to 3 inches.

18. The apparatus of claim 17 wherein said at least one pair of solder station rollers include a second pair of rollers positioned between the solder nozzles and the entry point of the covering belts.

19. The apparatus of claim 18 further including an oil application station comprising at least one oil nozzle mounted on the frame adjacent each belt downstream from the exit point of the belts for spraying oil on the corresponding belt.

20. The apparatus of claim 19 wherein the oil application station includes at least one brush rotatably mounted on the frame adjacent each belt downstream from the corresponding oil nozzle for removing excess oil from the belt.

* * * * *